United States Patent
Yang et al.

(10) Patent No.: US 8,486,284 B2
(45) Date of Patent: Jul. 16, 2013

(54) METHOD FOR FORMING A TOUCH SENSING PATTERN AND SIGNAL WIRES

(76) Inventors: Kai-Ti Yang, Taoyuan (TW);
Chih-Cheng Chang, Taoyuan (TW);
Chih-Yung Liu, Taoyuan (TW);
Chen-Ning Yang, Taoyuan (TW)

(*) Notice: Subject to any disclaimer, the term of this patent is extended or adjusted under 35 U.S.C. 154(b) by 294 days.

(21) Appl. No.: 12/947,826

(22) Filed: Nov. 17, 2010

(65) Prior Publication Data
US 2012/0118851 A1    May 17, 2012

(51) Int. Cl.
*H01B 13/00* (2006.01)

(52) U.S. Cl.
USPC ............ 216/13; 345/174; 345/178; 345/179; 178/18.01; 178/18.05; 178/18.07

(58) Field of Classification Search
USPC .......... 216/13; 345/174, 178, 179; 178/18.01, 178/18.05, 18.07
See application file for complete search history.

(56) References Cited

U.S. PATENT DOCUMENTS

| | | | |
|---|---|---|---|
| 6,380,497 B1 * | 4/2002 | Hashimoto et al. | 200/5 A |
| 6,819,316 B2 * | 11/2004 | Schulz et al. | 345/174 |
| 7,732,349 B2 * | 6/2010 | Yamamoto | 438/783 |
| 8,164,698 B2 * | 4/2012 | Kim et al. | 349/40 |
| 2009/0219257 A1 * | 9/2009 | Frey et al. | 345/173 |

* cited by examiner

*Primary Examiner* — Duy Deo
*Assistant Examiner* — Maki Angadi

(57) ABSTRACT

A method for forming a touch sensing pattern and signal wires, comprises the steps of: installing a first and a second conductive plating films on a surface of a highly transparency substrate; projecting a high energy light beam to the conductive plating films; and the high energy light beam moving with respect to the substrate along a predetermined track; a plurality of insulating trenches being formed in the first and second conductive plating films so as to form predetermined patterns for a sensing area and a wire area; a yellow light process being performed on the substrate; a layer of light resistor thin film being formed on a surfaces of the wire area; and etching the first conductive plating film in the sensing area; by above steps, the predetermined pattern in the sensing area being formed in the second conductive plating film.

8 Claims, 6 Drawing Sheets

METHOD FOR FORMING A TOUCH SENSING PATTERN AND SIGNAL WIRES

FIELD OF THE INVENTION

The present invention relates to a method for forming a touch sensing pattern and signal wires, in the present invention, a high energy light beam is used to form a desired pattern Yellow light process and etching process are used to remove the undesired portion so as to simplifying the manufacturing process, reduce the cost and decrease the working time. Furthermore, the yield rate can be increased greatly and the stability is increased greatly.

BACKGROUND OF THE INVENTION

It is known that the current touch panel has a central sensing area and a peripheral wire area. The sensing area has a plurality of touch sensors which is formed as a pattern. The wire area has a plurality of signal wires which are connected to the touch sensors, respectively so as to form as signal loops. In operation, by the finger of the user to touch the sensing area of the touch panel to induce a capacitive induction signal and a resistor induction signal. The variation of the capacitance and resistance will indicate the position of the finger and the conductor.

Currently in the manufacturing method for touch sensor pattern and the signal wires, referring to FIG. 9, a Mo/Al metal plating film 101 and an ITO plating film 102 are coated on a transparent substrate 100. A yellow light process is applied to the substrate for coating a layer of light resistor thin film 109 on the substrate (referring to FIG. 9). Then the substrate is placed to a furnace for heating. Then a mask 601 with a precision wire pattern is used to exposing the light resistor thin film 109 (referring to FIG. 10). Then the developing agent is applied to the light resistor thin film 109 for solidifying the exposing area. Next cleaning agent is used clean the un-exposing area of the light resistor thin film 109 so that the remove the light resistor material on the light resistor thin film 109 and a layer of solidified light resistor thin film FP (referring to FIG. 11) is formed on the un-exposing area (referring to FIG. 11). Then a further yellow light process is further applied to the substrate. Then, an etching agent suitable for Mo/Al metal film is applied to the substrate for etching out the Mo/Al metal plating film 101 not shielded by the light resistor thin film FP so as to retain the pattern of the signal wire 107 (referring to FIG. 12) on the light resistor thin film (referring to FIG. 12). Then a film removing agent is applied to the light resistor thin film FP on the substrate. Then cleaning agent is used to clean the substrate so as to expose the signal wire 107 on the Mo/Al metal plating film (referring to FIG. 13).

Then a second yellow light process is applied. That is, a layer of light resistor thin film 109 is coated on the upper surface of the substrate (referring to FIG. 14). Then the substrate is placed to a furnace for preheating. Next, a mask 602 with precise patterns of the sensing area and wire area is used to expose the light resistor thin film 109 (referring to FIG. 15). Then the developing agent is applied to the light resistor thin film for solidifying the exposing area. Next cleaning agent is used clean the un-exposing area of the light resistor thin film so as to remove the light resistor material on the light resistor thin film 109 and a layer of solidified light resistor thin film FP (referring to FIG. 16) is formed on the sensing area 103 and wire area 104. Then a further yellow light process is further applied to the substrate. An etching agent for ITO thin film is applied to the substrate for etching out the film not shielded by the light resistor thin film FP so as to retain the pattern of the touch sensor pattern 106 and signal wire 107 (referring to FIG. 17) on the light resistor thin film. Then a film removing agent is applied to the light resistor thin film FP on the substrate. Then cleaning agent is used to clean the substrate so as to expose the touch sensor pattern 106 on the ITO film and the signal wire 107 on the Mo/Al metal plating film (referring to FIG. 18).

In above mentioned process for touch sensor pattern and the signal wires, the first yellow light process and the first etching process are used to form the signal wires 107 on the Mo/Al plating film 101. Then the second yellow light process and the second etching process are used to form the touch sensor pattern 106 on the ITO plating film 102. Therefore, it is known that in the prior art, the yellow light processes and wet etching processes are used. Each process contains the steps of coating light resistor, preheating, exposure, development, etching, filming removing, etc. The process is tedious and the yield ratio is low. In fact it is known that in this prior art, the yield rate is about 70%. It is necessary to be improved.

SUMMARY OF THE INVENTION

The present invention provides a method for forming a touch sensor pattern and signal wires. In the present invention, a high energy light beam is used to form a desired pattern Yellow light process and etching process are used to remove the undesired portion so as to simplifying the manufacturing process, reduce the cost and decrease the working time. Furthermore, the yield rate can be increased greatly and the stability is increased greatly.

To achieve above object, the present invention provides a method for forming a touch sensing pattern and signal wires, comprising the steps of: installing a first and a second conductive plating films on a surface of a highly transparency substrate; projecting a high energy light beam to the conductive plating films; and the high energy light beam moving with respect to the substrate along a predetermined track; a plurality of insulating trenches being formed in the first and second conductive plating films so as to form predetermined patterns for a sensing area and a wire area; a yellow light process being performed on the substrate; a layer of light resistor thin film being formed on a surfaces of the wire area; and etching the first conductive plating film in the sensing area; by above steps, the predetermined pattern in the sensing area being formed in the second conductive plating film; and the first and second conductive plating films being existed in the wire area with a predetermined pattern.

The substrate is a plane thin film with a material selected of glass, poly carbonic ether, polyester, poly methacrylic methyl ester, and cyclic alkene copolymerization which are transparent and flexible and are soft or hard.

The second conductive plating film is a high transparency conductive plating film.

The high energy light beam is an ultra-short pulse Gaussian beam or an ultra-short pulse laser.

A width of each trench is between 1 to 100 μm.

The predetermined pattern of the sensing area is formed as a plurality of signal sensing units and the predetermined pattern in the wire area is formed as a plurality of signal conductive wires which are connected to the signal sensing units, respectively so as to form as a plurality of signal sensing loops.

The yellow light process further including the following steps: a layer of light resistor thin film being coated upon a surface of the conductive plating film; locating the high transparent substrate in a furnace; hot wind of 60° C.~90° C. being blown to the light resistor thin film about 100 to 140 seconds; then the temperature is reduced gradually to be about 25° C.; exposing the light resistor thin film by using an ultraviolet light source with an energy of 150~250 MJ/cm2; a light mask being installed between the light resistor thin film on the wire area and the light source and being retained with a distance of 30 μm~80 μm; and the light resistor thin film being exposed; and a wire pattern on the light mask being transferred to the light resistor thin film; and a developing agent with a pressure of 0.5 Kg/cm2 being applied to the light resistor thin film for solidifying the exposure area of the light resistor thin film; then a cleaning agent of 0.5 Kg/cm2 being used to clean the un-exposing part of the light resistor thin film so as to remove the light resistor on the un-exposing area of the light resistor thin film to form as a layer of solidified light resistor thin film on the wire area of the substrate.

The coating method is one of rotary coating, slit coating and capillarity coating.

The etching process further comprises the step of: spraying an etching agent with a pressure of 0.6 Kg/cm2 to the substrate for etching out the first conductive plating film in the sensing area i.e., not shielded by the light resistor thin film; then using a cleaning agent with spraying pressure of 1.5 Kg/cm2 to clean the substrate to expose the pattern of the sensing area on the second conductive plating film; and spraying a film removing agent with a pressure of 0.6 Kg/cm2 to the light resistor thin film of the substrate so that the light resistor thin film is removed from the first conductive plating film; then using a cleaning agent with a spraying pressure of 1.5 Kg/cm2 to clean the substrate so as to expose the pattern on the wire area of the first conductive plating film.

The various objects and advantages of the present invention will be more readily understood from the following detailed description when read in conjunction with the appended drawing.

DETAILED DESCRIPTION OF THE INVENTION

In order that those skilled in the art can further understand the present invention, a description will be provided in the following in details. However, these descriptions and the appended drawings are only used to cause those skilled in the art to understand the objects, features, and characteristics of the present invention, but not to be used to confine the scope and spirit of the present invention defined in the appended claims.

A layer of ITO (Indium-tin oxide) plating film 101 and a layer of Mo/Al metal plating film 101 are installed on a high transparent substrate 100 with a contact angle smaller than 10 degrees. The high transparent substrate 100 is located upon a working table 200. In this embodiment, a material of the high transparent substrate 100 is glass. However, other material is permissible in the present invention.

Figure 1:
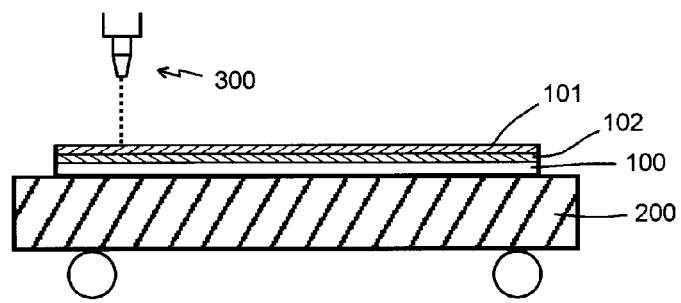
FIG. 1 shows the installation of the high energy light beam emitting device and the substrate.
Figure 2:
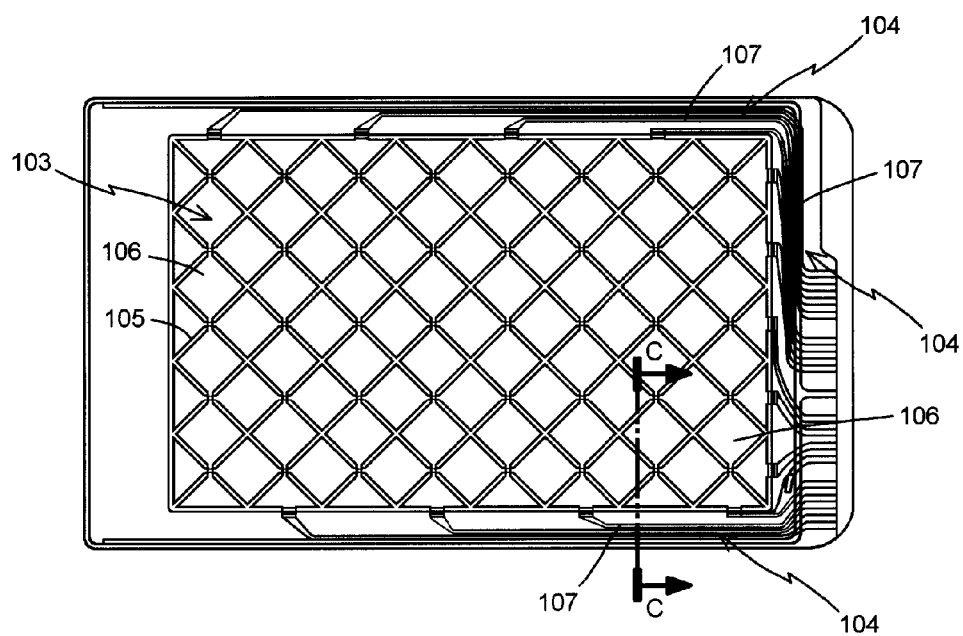
FIG. 2 is an elevational view of the substrate of the present invention, wherein the predetermined pattern of the trenches are formed on the plating film of the substrate.
Figure 3:
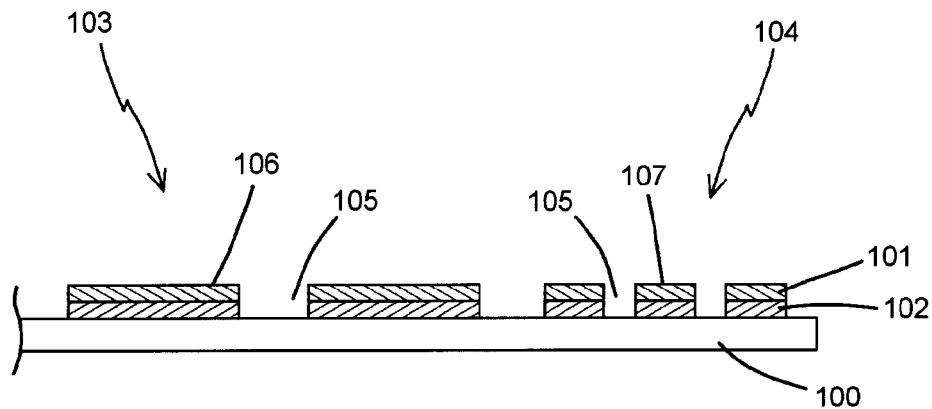
FIG. 3 is a cross section view along line C-C of FIG. 2.

The working table 200 is then placed to be below a high energy light beam emitting device 300 (see FIG. 1) so that the plating films 101, 102 are patterned by a high energy light beam. The high energy light beam emitting device 300 is a high energy pulse Gaussian beam having a power of 6 to 15 W and a pulse frequency of 65 to 75 KHz. When light is emitted from the high energy light beam emitting device 300 to the working table 200, the wire area 104 also moves with respect to the high energy light beam emitting device 300 along a predetermined track so that the pulse Gaussian beam can grave with a plurality of insulated cutting trenches on the plating films 101, 102 so as to form a predetermined patterns 105 for sensing area 103 and wire area 104 as illustration in FIGS. 2 and 3. Each cutting trench will completely cut through the plating film 101 and plating film 102 so that two sides of each trench are insulated. Each trench has a width of 1 to 100 um so that the precision of the pattern is very high. In this embodiment, a capacitive touch panel is used as an example. Thus the sensing area 103 in the center area of the pattern 105 includes a plurality of rhombus capacitive sensors which are arranged as a matrix so as to form as a touch sensor pattern 106. A wire area 104 is arranged along an outer periphery of the substrate. The wire area 104 is formed by a plurality of signal wires 107 which are connected to the capacitive sensors of the touch sensor pattern 106, respectively so as to form a plurality of capacitive signal sensor loops (referring to FIGS. 2 and 3). In particular, the patterns of the sensing area 103 and the wire area 104 are varied with the kinds of the touch panels selected. However, this is not a main concern of the present invention and thus the details will not be further described herein.

The high transparent substrate 100 is an ultra-short pulse Gaussian beam. By a précised adjustment, the energy density can be well controlled so that adiabatic heating can be achieved. Therefore, the high transparent substrate 100 will not be destroyed, while the patterns in the plating film 101 and plating film 102 can be achieved. However, other high energy light beam is also permissible in the present invention.

Next, a yellow light process is used for coating a layer of light resistor thin film on the wire area 104. The yellow light process includes the processes of coating light resistor, pre-heating, exposing, development, etc. The steps will be described herein.

Figure 4:
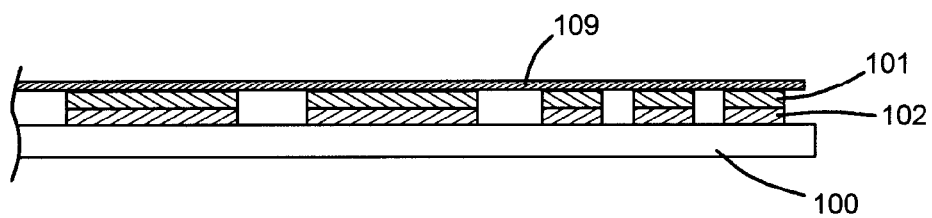
FIG. 4 is a lateral cross section view of the substrate, it is illustrated that a layer of light resistor thin film is coated on the surface of the Mo/Al metal thin film.

(1) Coating a layer of light resistor: a layer of light resistor thin film 109 is coated upon the Mo/Al metal plating film 101 (referring to FIG. 4). At least one of rotary coating, slit coating and capillary coating is used as a coating method. However, these are not used to confine the scope of the present invention. In this embodiment, a negative light resistor with a viscosity of 2 to 10 cps is used, for example polyisoprene.

(2) Pre-heating: locating the high transparent substrate 100 in a furnace. Hot wind of 80° C. blows to the light resistor thin film 109 about 120 seconds. Then the temperature is reduced gradually to be about 25° C. so as to increase the adhering force of the light resistor thin film 109 to the substrate.

Figure 5:
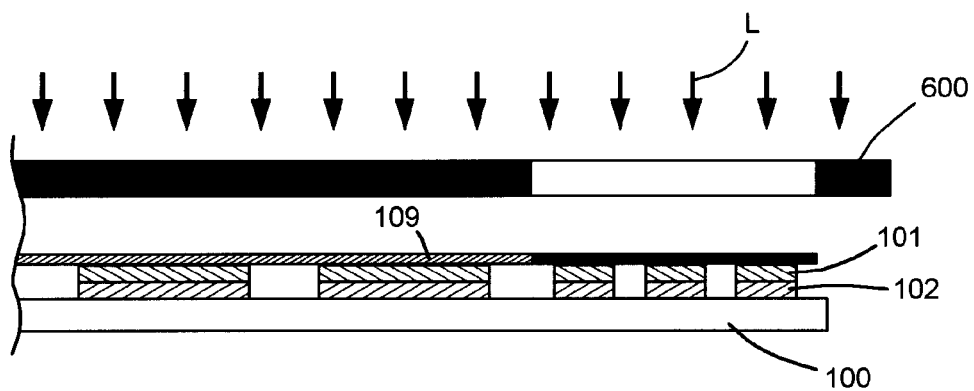
FIG. 5 is a lateral cross section view of the substrate showing that a mask is used to expose the light resistor thin film.

(3) Exposure: The heated substrate is transferred to an exposure machine and a light mask 600 with a wired pattern is installed between a light source L and the light resistor thin film 109 and is retained with a gap of 50 μm. Then an ultra-violet light with energy of 100 MJ/cm2 incidents to the negative light resistor thin film 109 for exposure (referring to FIG. 5) so that the exposing area of the light resistor thin film 109 is reacted to have the effect of resistor.

Figure 6:
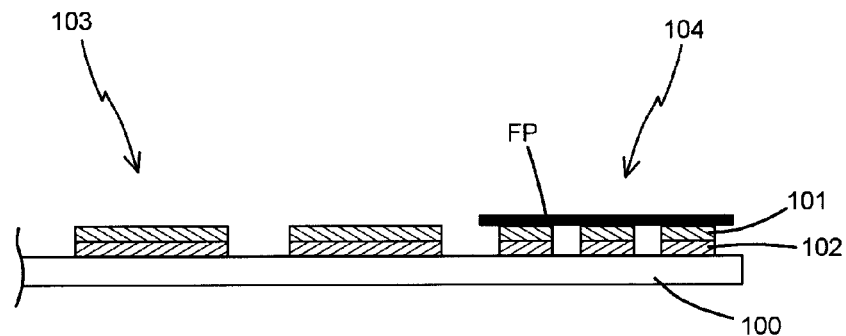
FIG. 6 is a lateral cross section view of the substrate of the present invention, it is illustrated that the wire area is formed and a solidified light resistor thin film is formed on the wire area.

(4) Development: after exposure, a developing agent with a pressure of 0.5 Kg/cm2 (such as XYlene or Sodium carbonate) is applied to the light resistor thin film 109 for solidifying the exposure area 109A of the light resistor thin film 109. Then a cleaning agent of 0.5 Kg/cm2 (for example, Butyl Acetate or clean water) is used to clean the un-exposing part 109B of the light resistor thin film so as to remove the negative light resistor on the un-exposing area of the light resistor thin film 109 to form with a layer of solidified light resistor thin film FP on the wire area 104 of the substrate. In this embodiment, the solidified light resistor thin film FP exactly shields the wire area 104 (referring to FIG. 6).

In above mentioned embodiment, a negative light resistor thin film is used for description. However, the above mentioned steps are suitable for positive light resistor thin film. The differences are the design of the mask and process for leaving or removing of the exposing area. However, these differences will not affect the present invention.

Figure 7:
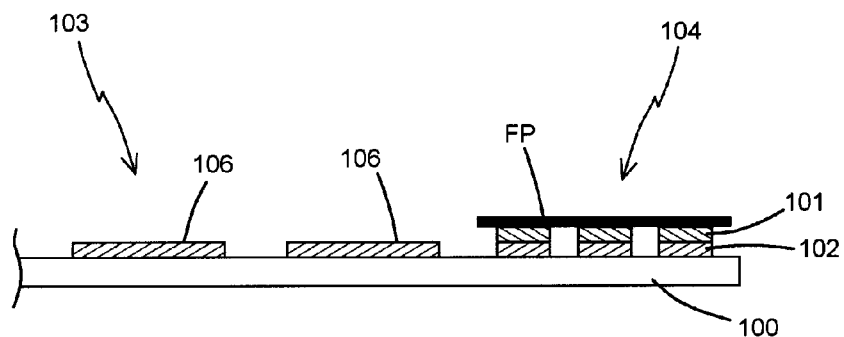
FIG. 7 is a lateral cross section view of the substrate of the present invention, where is a schematic cross section view of the substrate of the present invention, where the Mo/Al metal thin film in the sensing area is removed.

Then an etching process is used to remove the Mo/Al metal plating film 101 on the area not protected by the light resistor thin film FP so that the lower ITO plating film 102 (i.e., the touch sensor pattern 106) exposes (referring to FIG. 7). In this embodiment, wet etching process is used. The way are: an etching agent (such aluminum acid) with a pressure of 0.6 Kg/cm2 is sprayed to the substrate for etching out the Mo/Al metal plating film 101 in the sensing area 103 (i.e., not shielded by the light resistor thin film FP). Then a cleaning/Neutralization agent with spraying pressure of 1.5 Kg/cm2 is used to clean the substrate.

Figure 8:
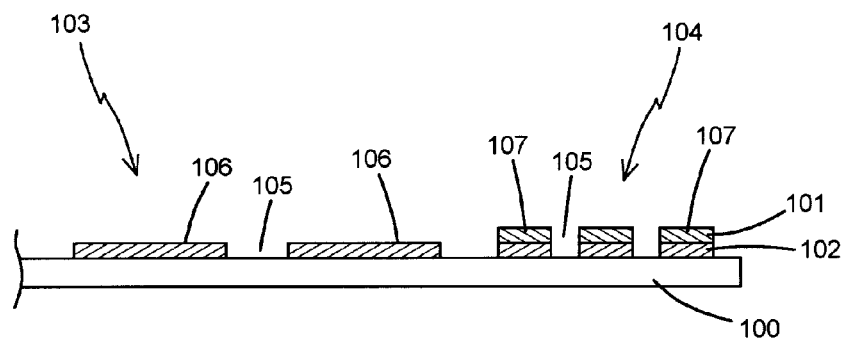
FIG. 8 is a schematic cross section view of the substrate of the present invention, where the solidified light resistor thin film in the wire area is removed.
Figure 9:
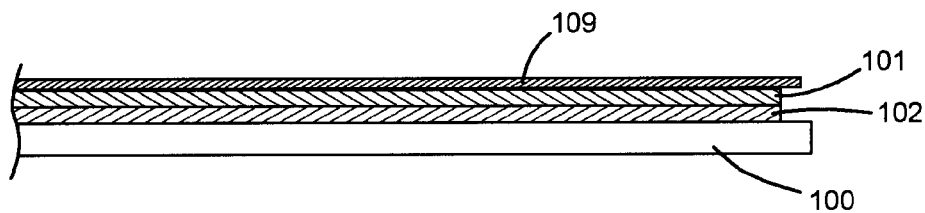
FIG. 9 is a schematic cross section view of the prior art, where the Mo/Al metal thin film is coated with a layer of light resistor thin film.
Figure 10:
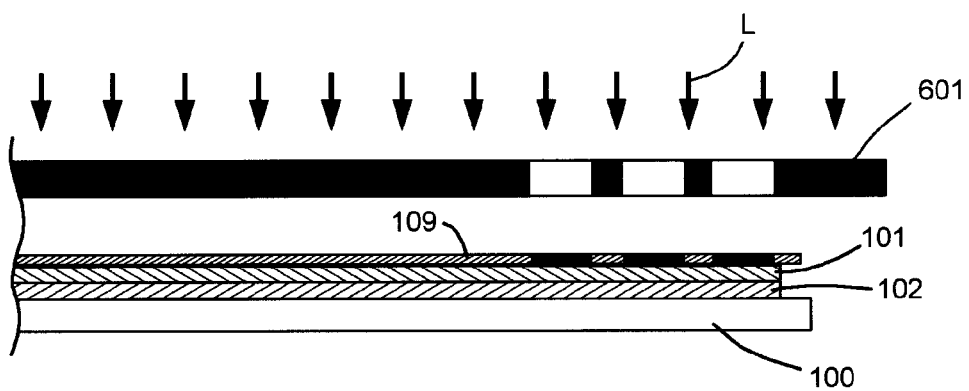
FIG. 10 is a schematic cross section view of the prior art, where a mask is used to expose the light resistor thin film.
Figure 11:
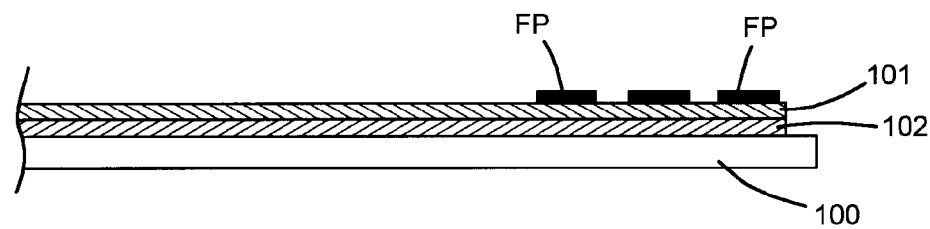
FIG. 11 is a lateral schematic cross section view of the prior art where a solidified light resistor thin film is installed on the wire area.
Figure 12:
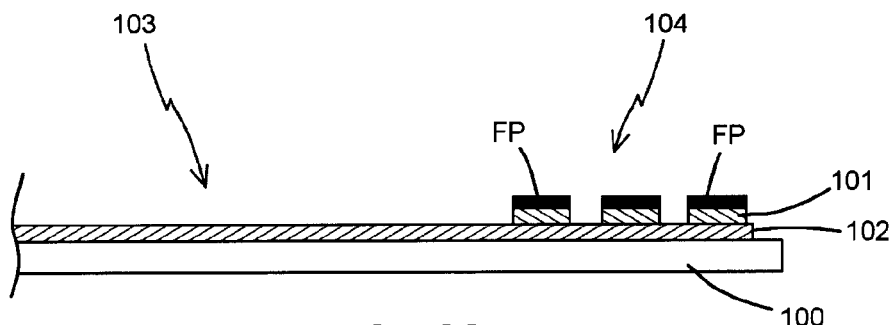
FIG. 12 is a lateral schematic cross section view of the prior art, where a part of Mo/Al metal thin film in the wire area and all the Mo/Al metal thin film in the sensing area are removed by etching.
Figure 13:
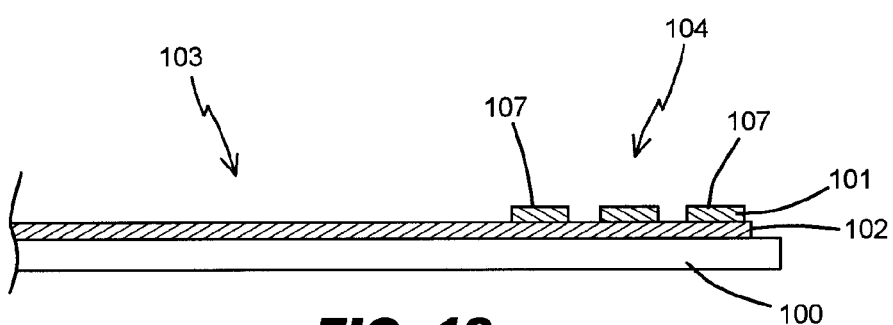
FIG. 13 is a lateral schematic cross section view of the substrate, where the solidified light resistor thin film in the wire area is removed.
Figure 14:
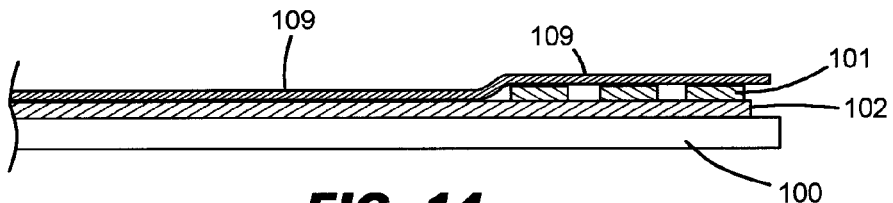
FIG. 14 is a lateral schematic cross section view of the substrate of the prior art, where a layer of light resistor thin film is coated upon the Mo/Al metal thin film and the ITO plating film.
Figure 15:
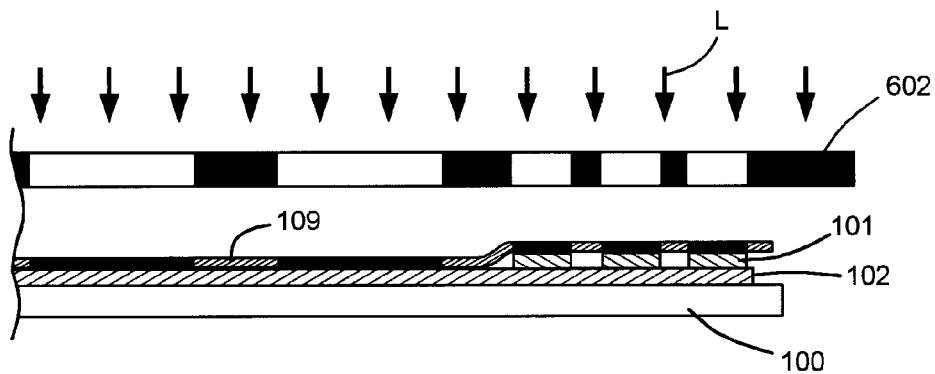
FIG. 15 is a lateral schematic cross section view of the prior art substrate, where a mask is used to expose the light resistor thin film.
Figure 16:
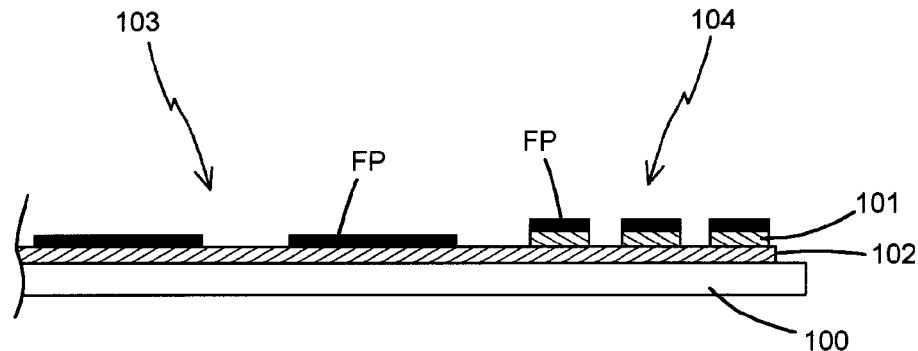
FIG. 16 is a lateral schematic cross section view of the prior art substrate, where a solidified light resistor thin film is installed in the sensing area and the wire area.
Figure 17:
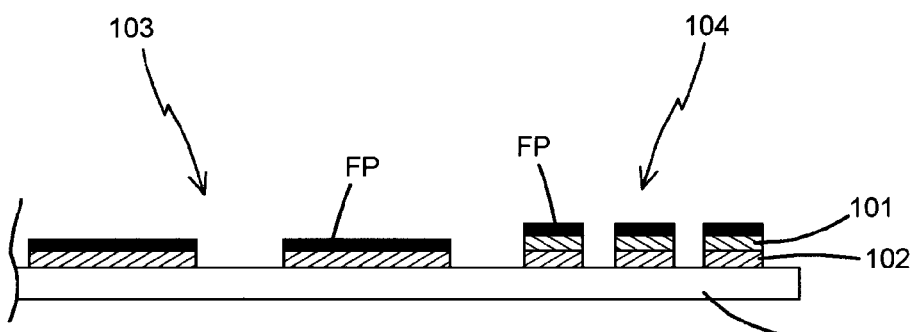
FIG. 17 is a lateral schematic cross section view of the prior art substrate, where parts of ITO plating film on the wire area and sensing area are etched out.
Figure 18:
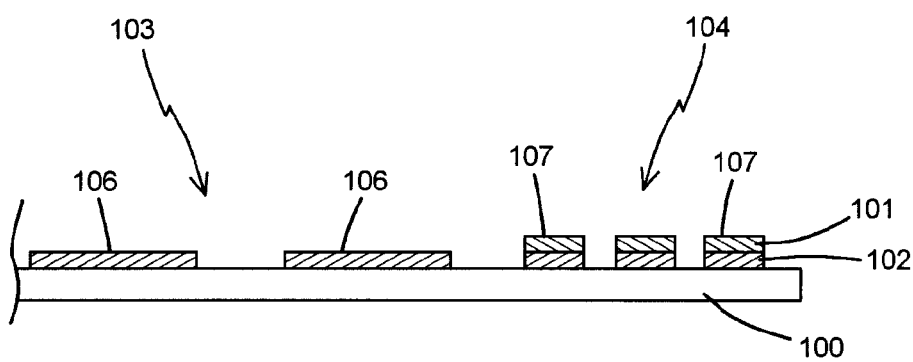
FIG. 18 is a lateral schematic cross section view of the prior art substrate, where it is illustrated that solidified light resistor thin film on the wire area and wire area are removed.

Lastly, a film removing process is used to remove the light resistor thin film FP on the substrate so that the Mo/Al metal thin film 101 in the wire area 104 (that is: the pattern of the signal wire 107) exposes out (referring to FIG. 8). The steps are: a film removing agent (such as KOH) with a pressure of 0.6 Kg/cm2 is sprayed to the light resistor thin film FP of the substrate so that the light resistor thin film is removed from the Mo/Al metal thin film 101. Then a cleaning agent (such as water) with a spraying pressure of 1.5 Kg/cm2 cleans the substrate.

After complete above mentioned steps, the touch sensor pattern 106 can be formed in the ITO plating film 102 in the sensing area 103 and the signal wires 107 are formed in the Mo/Al metal thin film 101 in the wire area 104.

From experimental results, it is illustrated that the manufacturing method of the present invention has a yield rate of 95% which is very higher than the prior art average yield rate of 70%. The details are illustrated in the following table.

TABLE 1

|  | Batch No. | No. of products | No. of Non-defective goods | No. of defective goods | Yield rate |
| --- | --- | --- | --- | --- | --- |
| Manufacturing method of the present invention. | 1 | 300 | 290 | 10 | 97% |
|  | 2 | 300 | 289 | 11 | 96% |
|  | 3 | 300 | 290 | 10 | 97% |
| Prior art manufacturing method | 1 | 300 | 210 | 90 | 70% |
|  | 2 | 300 | 205 | 95 | 68% |
|  | 3 | 300 | 215 | 85 | 72% |

In summary, as comparing with the prior art, a yellow process and an etching process are reduced so as to simplifying the manufacturing process, reduce the cost and decrease the working time. Furthermore, the yield rate can be increased greatly and the stability is increased greatly.

The present invention is thus described, it will be obvious that the same may be varied in many ways. For example, the high energy light beam emitting device 300 is an ultra short pulse Gaussian beam, but other ultra short pulse laser is also permissible. Such variations are not to be regarded as a departure from the spirit and scope of the present invention, and all such modifications as would be obvious to one skilled in the art are intended to be included within the scope of the following claims.

What is claimed is:

1. A method for forming a touch sensing pattern and signal wires, comprising the steps of:
   installing a first and a second conductive plating films on a surface of a highly transparency substrate;
   projecting a high energy light beam to the conductive plating films; and the high energy light beam moving with respect to the substrate along a predetermined track; a plurality of insulating trenches being formed in the first and second conductive plating films so as to form predetermined patterns for a sensing area and a wire area;
   a yellow light process being performed on the substrate; a layer of light resistor thin film being formed on a surfaces of the wire area; and
   wherein the yellow light process further including the following steps:
   a layer of light resistor thin film being coated upon a surface of the conductive plating film;

locating the high transparent substrate in a furnace; hot wind of 60° C.~90° C. being blown to the light resistor thin film about 100 to 140 seconds; then the temperature is reduced gradually to be about 25° C.;

exposing the light resistor thin film by using an ultraviolet light source with an energy of 150~250 MJ/cm2; a light mask being installed between the light resistor thin film on the wire area and the light source being retained with a distance of 30 μm~80μm; and the light resistor thin film being exposed; and a wire pattern on the light mask being transferred to the light resistor thin film; and a developing agent with a pressure of 0.5 Kg/cm2 being applied to the light resistor thin film for solidifying the exposure area of the light resistor thin film; then a cleaning agent of 0.5 Kg/cm2 being used to clean the un-exposing part of the light resistor thin film so as to remove the light resistor on the un-exposing area of the light resistor thin film to form as a layer of solidified light resistor thin film on the wire area of the substrate; and etching the first conductive plating film in the sensing area; by above steps, the predetermined pattern in the sensing area being formed in the second conductive plating film; and the first and second conductive plating films being existed in the wire area with a predetermined pattern.

2. The method for forming a touch sensing pattern and signal wires as claimed in claim 1, wherein the substrate is a plane thin film with a material selected of glass, poly carbonic ether, polyester, poly methacrylic methyl ester, and cyclic alkene copolymerization which are transparent and flexible and are soft or hard.

3. The method for forming a touch sensing pattern and signal wires as claimed in claim 1, wherein the second conductive plating film is a high transparency conductive plating film.

4. The method for forming a touch sensing pattern and signal wires as claimed in claim 1, wherein the high energy light beam is an ultra-short pulse Gaussian beam or an ultra-short pulse laser.

5. The method for forming a touch sensing pattern and signal wires as claimed in claim 1, wherein a width of each trench is between 1 to 100 μm.

6. The method for forming a touch sensing pattern and signal wires as claimed in claim 1, wherein the predetermined pattern of the sensing area is formed as a plurality of signal sensing units and the predetermined pattern in the wire area is formed as a plurality of signal conductive wires which are connected to the signal sensing units, respectively so as to form as a plurality of signal sensing loops.

7. The method for forming a touch sensing pattern and signal wires as claimed in claim 1, wherein the coating method is one of rotary coating, slit coating and capillarity coating.

8. The method for forming a touch sensing pattern and signal wires as claimed in claim 1, wherein the etching process further comprises the step of:

spraying an etching agent with a pressure of 0.6 Kg/cm2 to the substrate for etching out the first conductive plating film in the sensing area i.e., not shielded by the light resistor thin film; then using a cleaning agent with spraying pressure of 1.5 Kg/cm2 to clean the substrate to expose the pattern of the sensing area on the second conductive plating film; and spraying a film removing agent with a pressure of 0.6 Kg/cm2 to the light resistor thin film of the substrate so that the light resistor thin film is removed from the first conductive plating film; then using a cleaning agent with a spraying pressure of 1.5 Kg/cm2 to clean the substrate so as to expose the pattern on the wire area of the first conductive plating film.

* * * * *